United States Patent
Morito et al.

(10) Patent No.: US 9,722,013 B2
(45) Date of Patent: Aug. 1, 2017

(54) THIN FILM ELECTRONIC COMPONENT (71) Applicant: TAIYO YUDEN CO., LTD., Tokyo (JP)

(72) Inventors: Kentaro Morito, Tokyo (JP); Daiki Ishii, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/835,360

(22) Filed: Aug. 25, 2015

(65) Prior Publication Data

US 2016/0064473 A1  Mar. 3, 2016

(30) Foreign Application Priority Data

Aug. 26, 2014 (JP) ................................ 2014-171344

(51) Int. Cl.
  *H01L 23/48* (2006.01)
  *H01L 49/02* (2006.01)
  *H01L 21/768* (2006.01)
  H01L 27/02 (2006.01)

(52) U.S. Cl.
  CPC ........ *H01L 28/60* (2013.01); *H01L 21/76816* (2013.01); *H01L 28/40* (2013.01); *H01L 27/0207* (2013.01); *H01L 2924/0002* (2013.01)

(58) Field of Classification Search
  None
  See application file for complete search history.

(56) References Cited

U.S. PATENT DOCUMENTS

| | | | | |
|---|---|---|---|---|
| 2003/0190817 A1* | 10/2003 | Horikawa | ........... | B81C 1/00095 438/758 |
| 2004/0130849 A1 | 7/2004 | Kurihara et al. | | |
| 2005/0221609 A1* | 10/2005 | Yotsuya | ................. | H05B 33/10 438/637 |
| 2007/0034989 A1* | 2/2007 | Shioga | .................... | H01G 4/33 257/532 |
| 2015/0155222 A1* | 6/2015 | Shealy | .................. | H01L 23/481 257/76 |

FOREIGN PATENT DOCUMENTS

JP  2004-214589 A  7/2004

* cited by examiner

*Primary Examiner* — Reema Patel
(74) *Attorney, Agent, or Firm* — Chen Yoshimura LLP (57) ABSTRACT

A thin film electronic component includes: a substrate; a thin film electrode layer over the substrate; an inorganic insulation layer formed on the thin film electrode layer; an organic insulation layer formed on the inorganic insulation layer; and a lead-out electrode that electrically connects to the thin film electrode layer. The inorganic insulation layer has a through-hole formed therein, so as to expose a portion of the thin film electrode layer. The organic insulation layer has a through-hole formed therein, so as to expose the through-hole in the inorganic insulation layer. The lead-out electrode is formed in the through-hole in the inorganic insulation layer and the through-hole in the organic insulation layer. A shape of a borderline defining the through-hole at a top surface of the organic insulation layer in a plan view has chamfered corners.

3 Claims, 6 Drawing Sheets

THIN FILM ELECTRONIC COMPONENT

BACKGROUND OF THE INVENTION

Technical Field

The present invention relates to a thin film electronic component that constitutes a prescribed functional component. The component is created by forming a conductive layer and an insulation layer on a supporting substrate via a thin film fabrication process.

Background Art

Thin film capacitors are one well-known type of this type of thin film electronic component (see Patent Document 1, for example). This kind of thin film capacitor includes: a supporting substrate such as a silicon substrate; a capacitance section formed of a metallic thin film electrode such as platinum and a dielectric layer that is made up of a metal oxide formed via a thin film fabrication process such as sputtering; a protective insulation layer formed of an organic resin film that covers the entire silicon supporting substrate, which includes the capacitance section; a barrier layer that is made up of a non-conductive inorganic material and that is formed between the capacitance section and the protective insulation layer; and a lead-out electrode that is formed to pass through the protective insulation layer and the barrier layer and that is electrically connected to the metallic thin film electrode in the capacitance section.

The aim of using such a structure for a thin film electronic component is to maintain the impact-resistance and moisture-resistance properties of the component by having the protective insulation layer that is formed of an organic resin film absorb mechanical stress from the lead-out electrode, and having the barrier layer prevent moisture released by the organic resin film from reaching the dielectric layer.

RELATED ART DOCUMENT

Patent Document

Patent Document 1: Japanese Patent Application Laid-Open Publication No. 2004-214589

SUMMARY OF THE INVENTION

There have been some problems with the structure of conventional thin film electronic components, depending on the specific shape, material, mounting conditions, and the like of the various parts. These problems include not being able to adequately maintain the impact-resistance and moisture-resistance properties, and degradation of certain electric properties and, especially in the case of thin film capacitors, capacitance properties. These problems will be explained in more detail below using the example of a thin film capacitor.

In conventional thin film capacitors, the outermost layer is covered by an organic resin film, which is exposed to the surrounding environment. When the organic resin film absorbs moisture from the surrounding environment and expands, there is the possibility that stress may be generated. In addition, in thin film electronic components in which materials with different thermal expansion coefficients have been stacked, there is the possibility that significant structural stress will occur and lead to structural problems such as cracks and parts becoming detached. There is also the possibility that the lead-out electrode will become detached as a result of cracks forming in the barrier layer and the protective insulation layer due to stress. This may lead to moisture entering the component at locations where the lead-out electrode meets the barrier layer and the protective insulation layer, which may result in a degradation of the properties of the thin film capacitor.

Polyimide resins are often used as the organic resin film. Precursors of polyimide resins become polyimide resins after being cured at a temperature of 300° C. to 400° C. When the polyimide precursor that will become the protective insulation layer is cured, however, an acid anhydride and a diamine undergo a dehydration-polycondensation reaction and release an $H_2O$ molecule. This $H_2O$ molecule breaks down into hydrogen ions as a result of being catalyzed by the platinum that forms the thin film electrode of the capacitor. These hydrogen ions make their way to and reduce the dielectric material. As a result, hydrogen ions reach the boundary of the thin film electrode and the dielectric body via diffusion or the like, and degrade the capacitance properties of the capacitance section by becoming mobile ions and removing oxygen from the dielectric section.

Meanwhile, through-holes are formed in the organic resin film via etching during the step of forming the lead-out electrode. In instances in which washing and development is not done properly during the step of developing the aperture region of the through-holes, there may be some leftover organic material in the aperture region. This leftover organic material may then release $H_2O$ during the curing process, which may be lead to the capacitance of the capacitance section being lower than the designed value.

Accordingly, the present invention is directed to a thin film electronic component that substantially obviates one or more of the problems due to limitations and disadvantages of the related art.

An object of the present invention is to provide a thin film electronic component with excellent impact-resistance and water-resistance properties.

To achieve the above-mentioned aims, the applicant focused on the planar structure of the lead-out electrode through-holes that were formed in the organic insulation layer.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a thin film electronic component, including: a substrate; a thin film electrode layer over the substrate; an inorganic insulation layer formed on the thin film electrode layer; an organic insulation layer formed on the inorganic insulation layer; and a lead-out electrode that electrically connects to the thin film electrode layer, wherein the inorganic insulation layer has a through-hole formed therein, so as to expose a portion of the thin film electrode layer, wherein the organic insulation layer has a through-hole formed therein, so as to expose the through-hole in the inorganic insulation layer, wherein the lead-out electrode is formed in the through-hole in the inorganic insulation layer and the through-hole in the organic insulation layer, and wherein a shape of a borderline defining the through-hole at a top surface of the organic insulation layer in a plan view has chamfered corners.

According to the above-described aspect of the present invention, physical stress can be prevented from becoming concentrated since the shape of the borderline defining the through-hole at a top surface of the organic insulation layer in a plan view has chamfered corners. This allows for improvements in both impact-resistance properties and moisture-resistance properties.

In the above-described thin film electronic component, the shape of the borderline defining the through-hole in the organic insulation layer may be a substantially rectangular shape having round-chamfered corners. In the above-described thin film electronic component, a radius of curvature of the round-chamfered corners may be greater than a thickness of the organic insulation layer.

In the above-described thin film electronic component, the shape of the borderline defining the through-hole in the organic insulation layer may be made of two parallel lines that are opposed to each other and are connected by arc-shaped curves on respective ends.

In the above-described thin film electronic component, the shape of the borderline defining the through-hole in the organic insulation layer may be a substantially rectangular shape having linearly-chamfered corners.

In the above-described thin film electronic component, each of the linearly-chamfered corners of the borderline may include at least two kinks having a bending angle greater than 90 degrees.

The above-described thin film electronic component may further include: a lower electrode layer over the substrate and under the thin film electrode layer; and a thin film dielectric layer sandwiched between the lower electrode layer and the thin film electrode layer, thereby forming a capacitor composed of the lower electrode layer, the thin film dielectric layer, and the thin film electrode layer.

The above-described thin film electronic component may further include: an upper electrode layer over a portion of the thin film electrode layer; and a thin film dielectric layer sandwiched between the portion of the thin film electrode layer and the upper electrode layer, thereby forming a capacitor composed of the portion of the thin film electrode layer, the thin film dielectric layer, and the upper electrode layer, wherein a portion of the thin film electrode layer that is not overlapped by the upper electrode layer is connected to the lead-out electrode via the through-hole.

According to at least some aspects of the present invention, physical stress can be prevented from becoming concentrated in the formation location of the lead-out electrode in the organic insulation layer, which allows for improvements in the impact-resistance properties and the moisture-resistance properties of the electronic component.

It is to be understood that both the foregoing general description and the following detailed description are exemplary and explanatory, and are intended to provide further explanation of the invention as claimed.

DETAILED DESCRIPTION OF EMBODIMENTS

Figure 1:
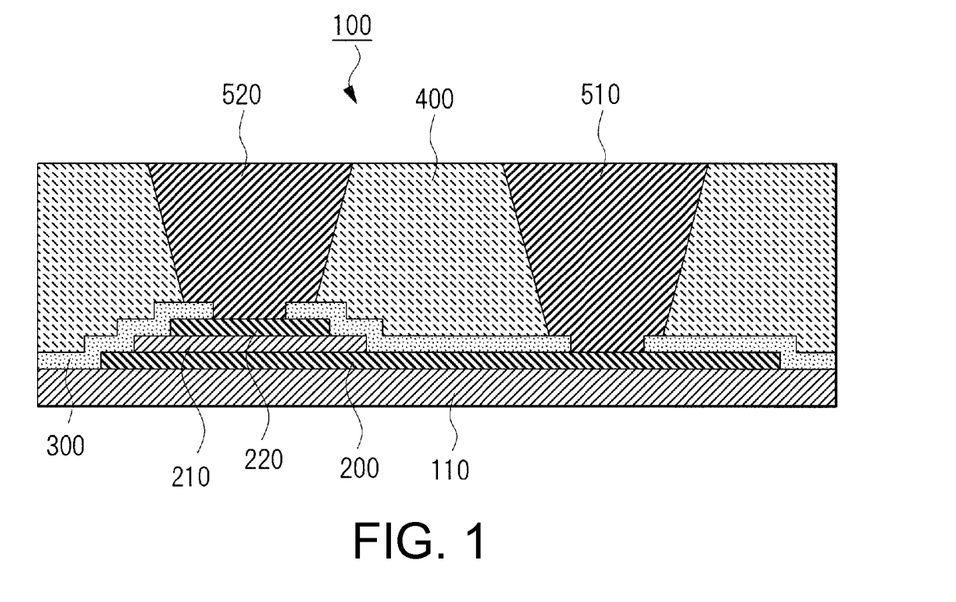
FIG. 1 is cross-section of a thin film capacitor according to an embodiment of the present invention.
Figure 2:
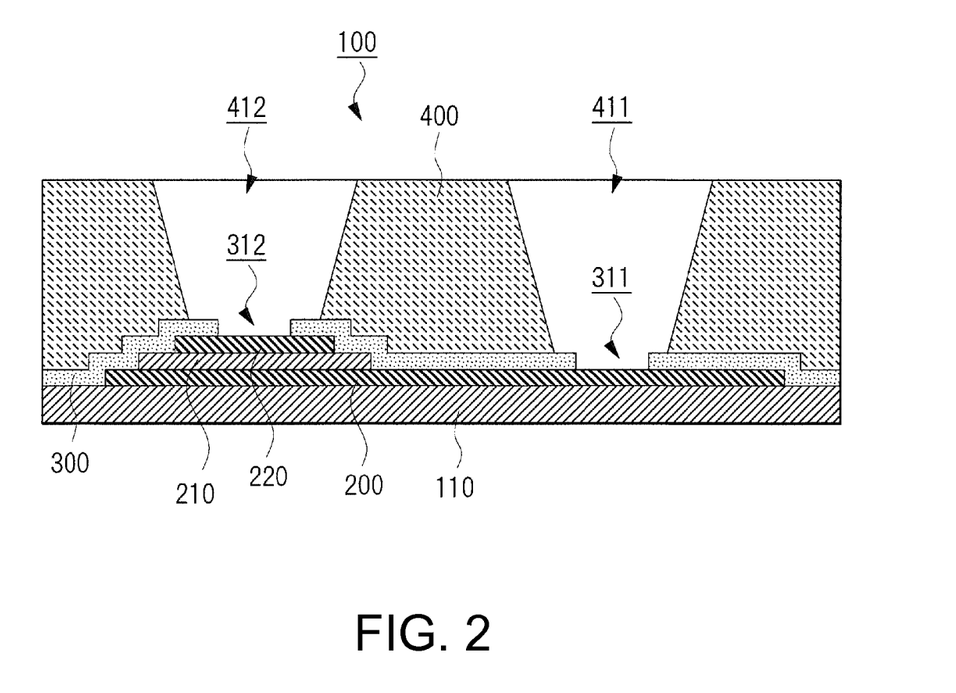
FIG. 2 is a cross-section of the thin film capacitor of FIG. 1 in which a lead-out electrode has been removed.
Figure 3:
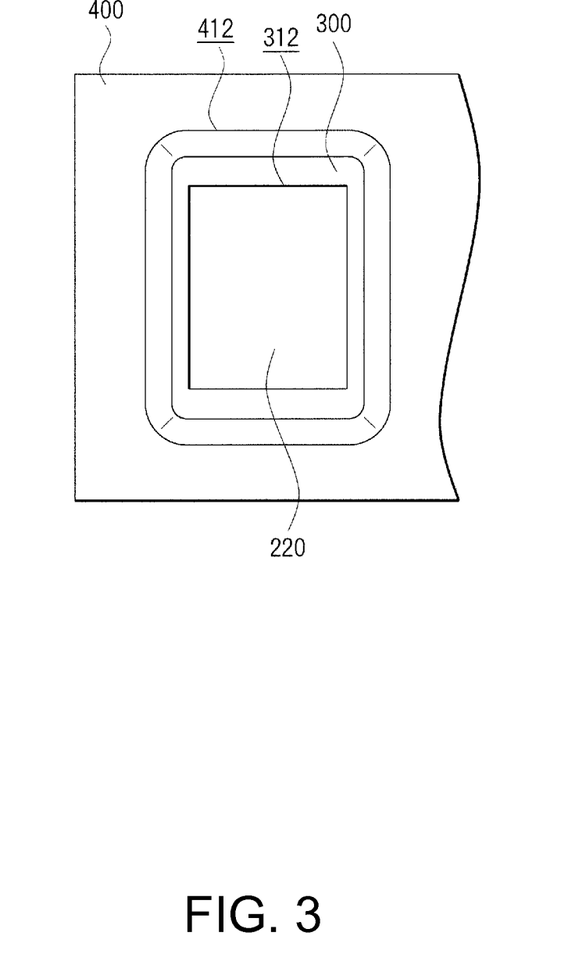
FIG. 3 is a plan view of the thin film capacitor of FIG. 1 in which the lead-out electrode has been removed.

A thin film electronic component according to an embodiment of the present invention will be explained with reference to the drawings. A thin film capacitor will be described in the present embodiment. FIG. 1 is a cross-section of a thin film capacitor, FIG. 2 is a cross-section of the thin film capacitor in which the lead-out electrode has been removed, and FIG. 3 is a plan view of the thin film capacitor in which the lead-out electrode has been removed. It should be noted that these various figures are schematic representations used to describe the invention and are not shown to scale.

As shown in FIG. 1, a thin film capacitor 100 includes: a supporting substrate 110; a first electrode layer 200 formed on the supporting substrate 110; a dielectric layer 210 formed on the first electrode layer; a second electrode layer 220 formed on the dielectric layer 210; a barrier layer 300 formed so as to cover the first electrode layer 200, the dielectric layer 210, the second electrode layer 220, and the supporting substrate 110; an insulation layer 400 formed so as to cover the barrier layer 300; a first lead-out electrode 510 that allows for the first electrode layer 200 to be connected to the exterior of the insulation layer 400; and a second lead-out electrode 520 that allows for the second electrode layer 220 to be connected to the top of insulation layer 400. In the thin film capacitor 100 according the present embodiment, the first electrode layer 200, the dielectric layer 210, and the second electrode layer 220 form a capacitance generation section. Also, the thin film capacitor 100 according to the present embodiment is used in a manner so as to: cause the upper surface of the insulation layer 400 to face a circuit board upon which the capacitor will be mounted, and electrically connect both the first lead-out electrode 510 and the second lead-out electrode 520 to the lands on the circuit board.

The supporting substrate 110 is made of silicon (Si), for example. The supporting substrate 110 can be formed from any material, however, and can be formed from an insulating supporting substrate made of quartz, alumina, sapphire, glass, or the like, or from a conductive supporting substrate made of silicon or the like, for example. It is preferable that an insulation layer be formed upon the supporting substrate 110 when a conductive supporting substrate is used as the supporting substrate 110. It is also preferable that an adhesive layer be formed on the supporting substrate 110 to improve adhesion with the first electrode layer 200. In the present embodiment, a silicon substrate is used as the supporting substrate 110, and an insulating adhesive layer (not shown) is formed upon the silicon substrate. The adhesive layer is formed of titanium oxide ($TiO_2$).

The capacitance generation section, which includes the first electrode layer 200, the dielectric layer 210, and the second electrode layer 220, has a so-called MIM (metal-insulator-metal) structure. The first electrode 200 is smaller than the supporting substrate 110, the dielectric layer 210 is smaller than the first electrode layer 200, and the second electrode layer 220 is smaller than the dielectric layer 210. This causes the edges of these various layers to have a stair-like structure, when viewed from the second electrode 220 toward the dielectric layer 210, the first electrode layer 200, and the supporting substrate 110. This type of structure has two purposes: to allow both the first electrode layer 200 and the second electrode layer 220 to be electrically connected to the top of the insulation layer 400, and to make the manufacturing process simpler.

The first electrode layer 200 and the second electrode layer 220 are ideally made of materials that are resistant to oxidation at high temperatures and that are able to satisfactorily control the alignment of crystals when the dielectric layer is formed. Specifically, the materials forming the first electrode layer 200 and the second electrode layer 220 contain either noble metals such as platinum (Pt), iridium (Ir), and ruthenium (Ru), or conductive oxides such as $SrRuO_3$, $RuO_2$, and $IrO_2$. Platinum (Pt) was used in the present embodiment. The first electrode layer 200 and the second electrode layer 220 are formed via a thin film formation process such as sputtering, for example.

In the present embodiment, the insulation layer 210 is made of an oxide that contains barium (Ba), strontium (Sr), and titanium. This oxide has the formula $Ba_xSr_{1-x}TiO_3$, and is hereafter referred to as BST. BST is a material that, despite being a thin film, has a rather high relative permittivity (over 500) at room temperature. This trait makes BST an ideal material for creating a thin film capacitor that is compact and has a large capacitance. The dielectric layer 210 is formed via a thin film formation process such as sputtering or the sol-gel method, for example.

The barrier layer 300 is formed so as to cover the entire top surface of the supporting substrate 110, which includes the capacitance generation section that contains the first electrode layer 200, the dielectric layer 210, and the second electrode 220. As mentioned above, the top surface of the barrier layer 300 takes on a stair-like shape when formed, due to the fact that the sizes of the first electrode layer 200, the dielectric layer 210, and the second electrode layer 220 are all different. It is preferable that the barrier layer 300 be formed of a non-conductive inorganic material such aluminum oxide ($Al_2O_3$) or silicon oxide ($SiO_2$), for example. It is also preferable that this material have a non-crystalline structure. Aluminum oxide ($Al_2O_3$) was used in the present embodiment. The barrier layer 300 is formed via a thin film formation process such as sputtering, for example.

As shown in FIGS. 2 and 3, a through-hole 311 is formed in the barrier layer 300 so that a specified lead-out position in the first electrode layer 200 is exposed. In addition, a through-hole 312 is formed in the barrier layer 300 so that a specified lead-out position in the second electrode layer 220 is exposed.

The insulation layer 400 is formed of an organic resin material such as a polyimide, for example. The insulation layer 400 is formed across the entire surface of the barrier layer 300. As shown in FIGS. 2 and 3, through-holes 411, 412 are formed in the insulation layer 400 so that the through-holes 311, 312 formed in the barrier layer 300 are exposed. In other words, the through-holes 411, 412 also include the area directly above the through-holes 311, 312, which means that a portion of the first electrode layer 200 and a portion of the second electrode layer 220 are exposed. The width of the through-holes 411, 412 gradually decreases downward from the top surface toward the barrier layer 300.

The through-hole 411 in the insulation layer 400 and the through-hole 311 in the barrier layer 300 are filled by a first lead-out electrode 510, which electrically connects the first electrode layer 200 to the exterior of the insulation layer 400. Similarly, the through-hole 412 in the insulation layer 400 and the through-hole 312 in the barrier layer 300 are filled by a second lead-out electrode 520, which electrically connects the second electrode layer 220 to the exterior of the insulation layer 400. The first lead-out electrode 510 and the second lead-out electrode 520 are formed from any conductive material or metal alloy made from Cu, Ni, Co, Cr, Ag, Au, Pd, Fe, Sn, Pt, or the like. If there is concern about the materials making up the first lead-out electrode 510 and the second lead electrode 520 reacting with the first electrode layer 200 and the second electrode layer 220, it is preferable that one or more non-reactive electrode materials be stacked where the lead-out electrodes come into contact with the first electrode layer 200 and the second electrode layer 220. Platinum (Pt) was used as the first insulation layer 200 and the second insulation layer 220 in the present embodiment, while tin (Sn) was used as the primary material to form the first lead-out electrode 510 and the second lead-out electrode 520. There is the possibility of problems occurring in such a case. To give an example, the tin (Sn) in the first lead-out electrode 510 and the second lead-out electrode 520 may diffuse to and react with the platinum (Pt) in the first electrode layer 200 and the second electrode layer 220, which would change the resistance of the two electrode layers. Thus, in the present embodiment, Cr, Ti, Cu, Ni, and the like were stacked below the first lead-out electrode 510 and the second lead-out electrode 520. This was done to prevent the above-mentioned erosion, as well as improve the wettability of the solder.

A unique characteristic of at least one aspect of the present invention is the planar shape of the through-holes 411, 412 formed in the insulation layer 400. The shape of the through-holes 411, 412 at the top surface of the insulation layer 400, or in other words, the shape of the border between the top of the insulation layer 400 and the through-holes 411, 412, is rectangular with round-chamfered corners, as is shown in FIG. 3. In other words, the shape of the through-holes 411, 412 is made up of two long sides that face each other, two short sides that face each other and that are perpendicular to the two long sides, and curved sections that are seamlessly connected to each of the various sides. To put it another way, the border between the through-holes 411, 412 and the top surface of the insulation layer 400 is a continuous line that includes one or more straight line sections. It is preferable that the radius of curvature of the curved sections be larger than the thickness of the insulation layer 400.

Next, a method of manufacturing the thin film capacitor 100 according to an embodiment of the present invention will be explained with reference to FIGS. 4A to 4C and 5A to 5D. FIGS. 4A to 4C and 5A to 5D show various steps in the manufacturing process of the thin film capacitor.

First, a silicon wafer is prepared as the supporting substrate 110 (FIG. 4A), and a film of titanium oxide ($TiO_2$) is formed on the silicon wafer using sputtering or the like. The titanium oxide ($TiO_2$) has a thickness of 20 nm, and functions as an adhesive layer (not shown) between silicon and platinum.

Figure 4A:
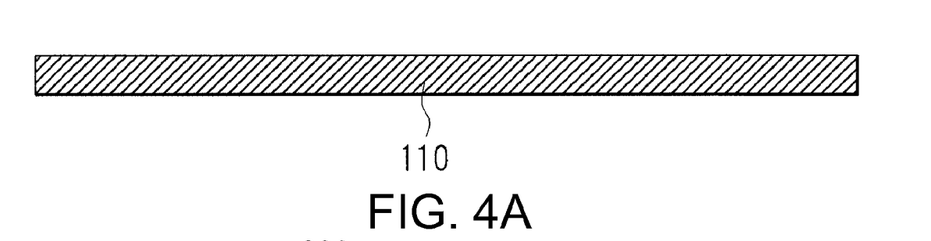
FIGS. 4A to 4C and 5A to 5D illustrate various steps in a manufacturing method of the thin film capacitor according to an embodiment of the present invention.
Figure 4B:
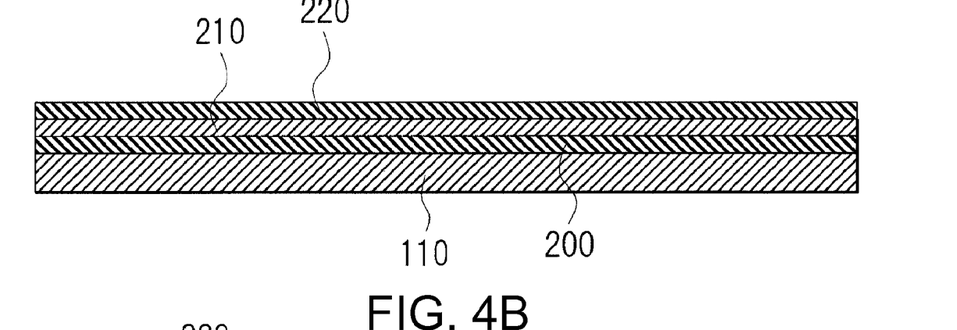

Next, the capacitance section, which has a MIM (metal-insulator-metal) structure, is formed upon the supporting substrate 110. First, a platinum film that corresponds to the first electrode layer 200 is formed upon the supporting substrate 110 using sputtering or the like. BST that corresponds to the dielectric layer 210 is then formed upon the first electrode layer 200 using sputtering or the sol-gel method. Next, a film of platinum that corresponds to the second electrode layer 220 is formed upon the dielectric layer 210 via sputtering (FIG. 4B). Here is an example of possible sputtering conditions for BST: a substrate temperature of 600° C., 100 W of RF power, argon+oxygen gas, and a gas pressure of 0.1 Pa.

Figure 4C:
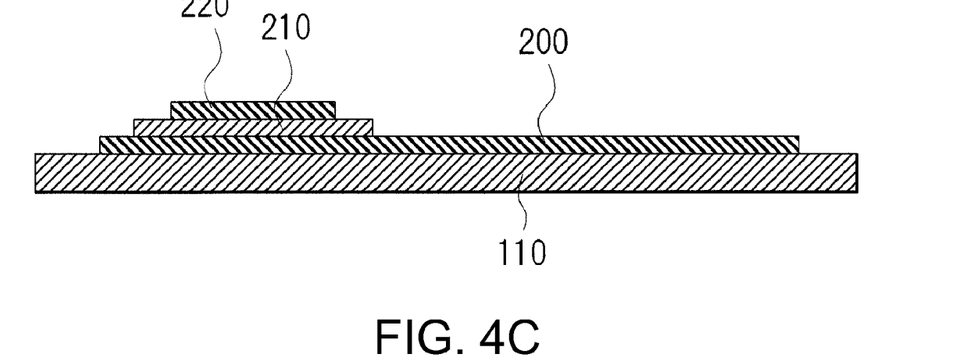

After a resist mask has been formed via photolithography, the next step is to remove portions of the various layers via a dry etching process, such as reactive ion etching, so that the layers take on a prescribed shape. This removal is conducted in a specific order: first, the second electrode layer 220, then the dielectric layer 210, and lastly the first electrode layer 200 (FIG. 4C). Argon ion milling was used for removal in the present embodiment. This process led to the formation of a staircase-like capacitance generation section in which the edges of the second electrode layer 220, the dielectric layer 210, and the first electrode layer 200 were each shaped like one stair in the staircase.

Figure 5A:
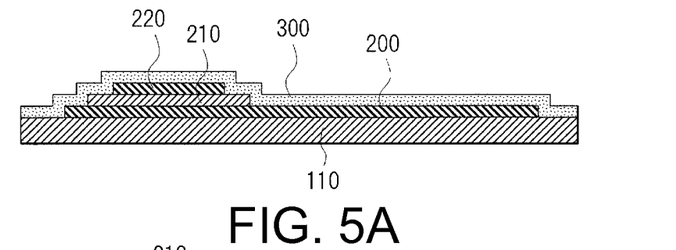

Next, a barrier layer 300 was formed so as to cover the capacitance generation section and the supporting substrate 110. Specifically, aluminum oxide ($Al_2O_3$) was used to form the barrier layer 300. The aluminum oxide was formed in a thin film using sputtering (FIG. 5A).

Figure 5B:
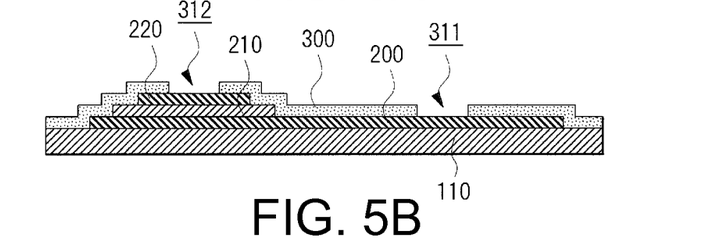

After a resist mask has been formed via photolithography, the next step is to remove portions of the barrier layer 300 to form the through-holes 311, 312 therein. This is done via a dry etching process, such as reactive ion etching (FIG. 5B).

Figure 5C:
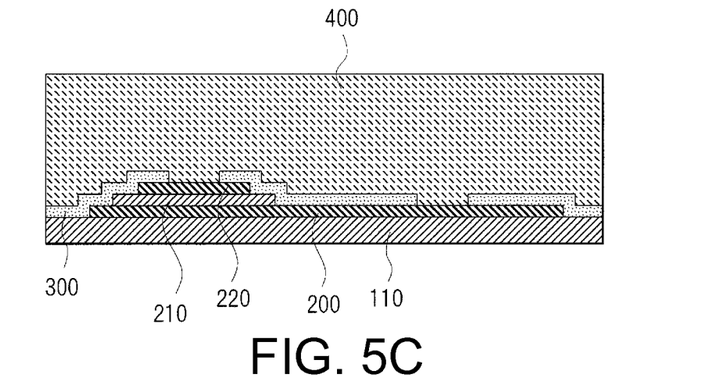

Next, an insulation layer 400 made of a polyimide resin or the like is formed on the barrier layer 300 (FIG. 5C). In the present embodiment, a 4 μm film is formed by spin coating a photosensitive polyimide precursor liquid at 3000 rpm for 30 seconds. The liquid is then heated (pre-baked) for 10 minutes at a temperature of 60° C. Later, after exposure and development are performed, the precursor is heated (baked) for two hours at 400° C., forming a polyimide film with a thickness of 2 μm.

Figure 5D:
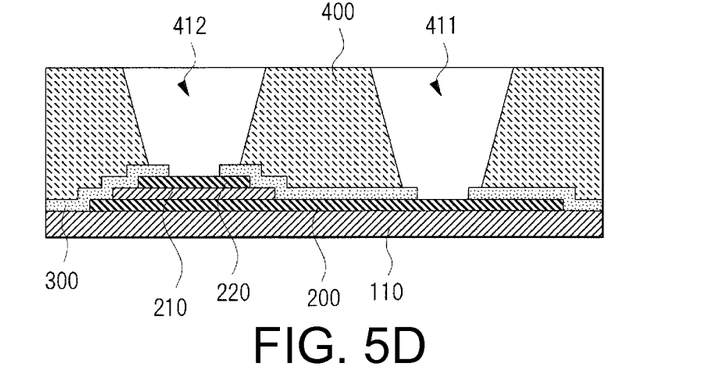

Next, after a resist mask is formed via photolithography, through-holes 411, 412 are formed in the insulation layer 400 using wet etching (FIG. 5D). In this process, the polyimide filling the through-holes 311, 312 in the barrier layer 300 is removed, exposing prescribed lead-out positions in the first electrode layer 200 and the second electrode layer 220.

Lastly, a first lead-out electrode 510 and a second lead-out electrode 520 are formed so as to fill the through-holes 411, 412 in the insulation layer 400 and the through-holes 311, 312 in the barrier layer 300. In this process, a thin film of underlying materials (not shown) is formed, via sputtering, on the inner surface of the through-holes 411, 412 in the insulation layer 400 and the through-holes 311, 312 in the barrier layer 300. Next, plating is used to fill the through-holes with the lead-out electrode material.

In such a thin film capacitor 100, the insulation layer 400, which is formed of a polyimide that is hygroscopic and releases moisture under certain conditions, and the capacitance generation section are physically separated from one another. In other words, moisture released by the polyimide resin does not become ionized and is blocked before reaching the electrode section, which has catalytic properties. As a result, the moisture released by the polyimide resin is prevented from reaching the top surface of the first electrode layer 200 and the second electrode layer 220, which are formed of platinum, platinum having catalytic properties.

Figure 6:
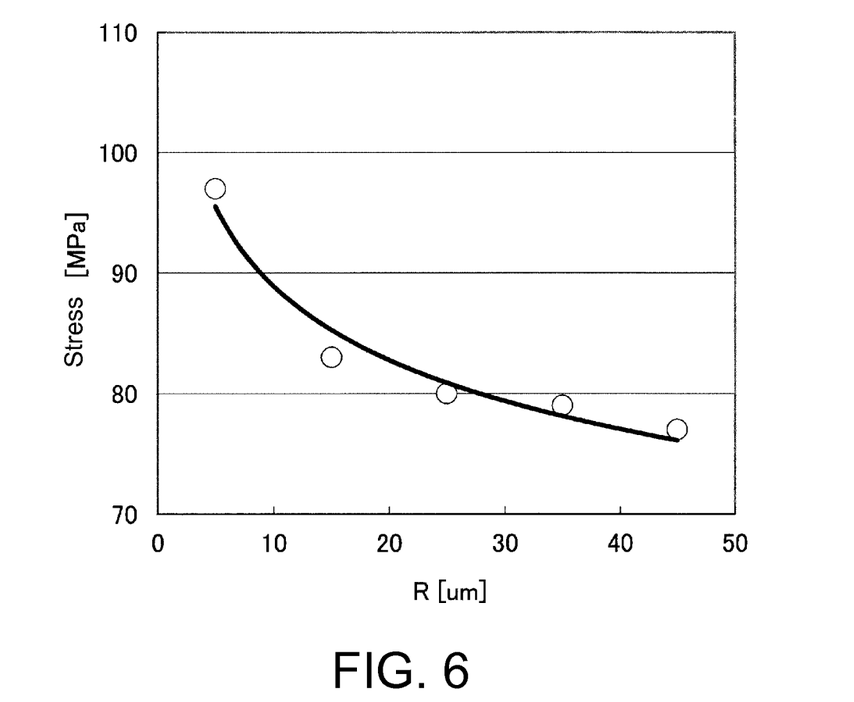
FIG. 6 shows the relationship between physical stress in corners of a through-hole formed in an insulation layer and a radius of curvature of the corners.

In addition, in the thin film capacitor 100 according to the present embodiment, the shape of the through-holes 411, 412 in the insulation layer 400 that define the shape of the first lead-out electrode 510 and the second lead-out electrode 520 have a substantially rectangular shape with round-chamfered corners. In other words, the border between the top surface of the insulation layer 400 and the through-holes 411, 412 has a substantially rectangular shape with round-chamfered corners. As a result, physical stress can be prevented from becoming concentrated in the corners of the through-holes 411, 412. FIG. 6 is a graph that shows the results of an analysis conducted, via simulation, on the relationship between the stress on the corners of the through-holes 411, 412 and the radius of curvature of the round-chamfered corners of the through-holes 411, 412. As is evident from FIG. 6, the analysis confirmed that stress was decreased by making the corners of the through-holes 411, 412 round-chamfered, and also confirmed that the amount of stress decreased as the radius of curvature became larger. In this way, in the thin film capacitor 100 according to the present embodiment, the amount of stress on the corners of the through-holes 411, 412 can be decreased. As a result, cracks can be prevented from forming in the insulation layer 400 and the barrier layer 300, and moisture can be prevented from entering via the cracks and causing degradation in the properties of the thin film capacitor 100.

In addition, no residual resin, which is used to form the insulation layer 400, will be left over in the through-holes 411, 412 after the formation of the through-holes 411, 412. This is a result of the above-mentioned shape of the through-holes 411, 412 in the insulation layer 400. This means that the first lead-out electrode 510 and the second lead-out electrode 520 can be properly connected to the first electrode layer 200 and the second electrode layer 220, and that moisture and the like can be prevented from entering into the thin-film capacitor 100.

As described above, according to the thin film capacitor 100 of the present embodiment, physical stress can be prevented from becoming concentrated at the positions in the insulation layer 400 where the first lead-out electrode 510 and the second lead-out electrode 520 are formed. This will lead to an improvement in the impact-resistance and moisture-resistance properties of the capacitor.

Figure 7:
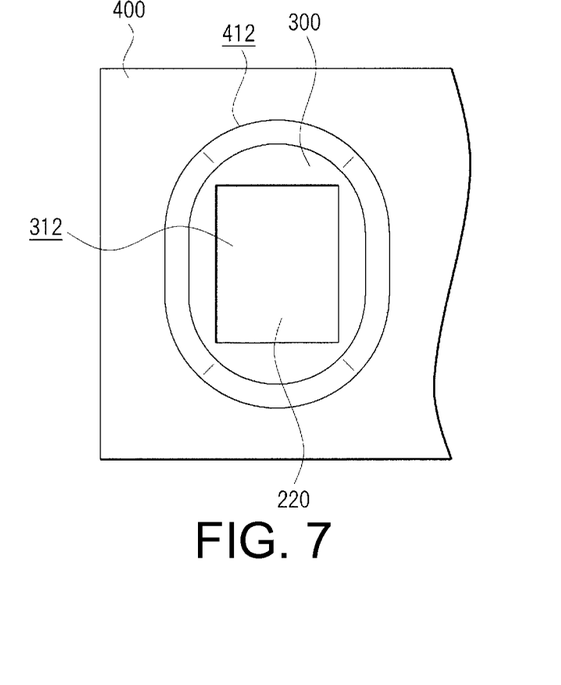
FIG. 7 is a plan view of another example of the thin film capacitor according to an embodiment of the present invention in which the lead-out electrode has been removed.

Embodiments of the present invention were described above, but the present invention is not limited thereto. For example, in the above-mentioned embodiments, the through-holes 411, 412 in the insulation layer 400 had a rectangular shape with curved corners. However, as shown in FIG. 7, the through-holes 411, 412 may have a shape in which two facing sides are connected by curved lines. In this example, the sides and the curved sections are connected together and are continuous. Even if such a shape is used, however, functions and effects similar to those of the above-mentioned embodiments can be obtained.

Figure 8:
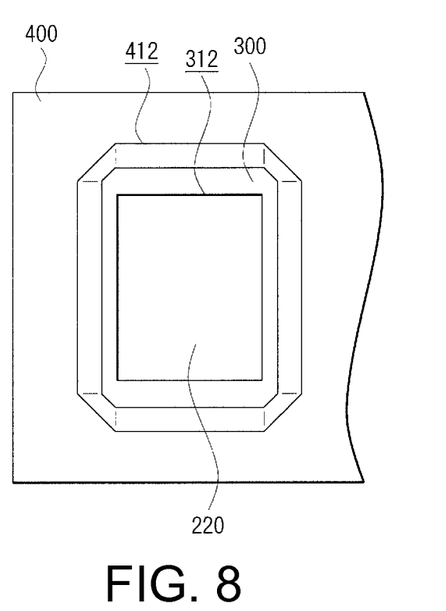
FIG. 8 is a plan view of another example of the thin film capacitor according to an embodiment of the present invention in which the lead-out electrode has been removed.
Figure 9:
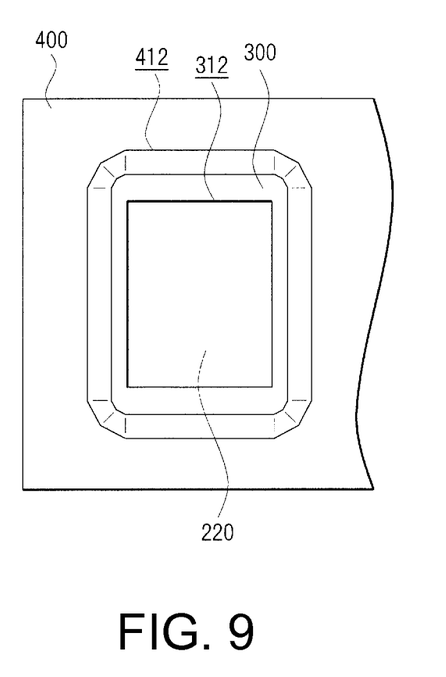
FIG. 9 is a plan view of another example of the thin film capacitor according to an embodiment of the present invention in which the lead-out electrode has been removed.

Also, in the above-mentioned embodiments, the border between the insulation layer 400 and the through-holes 411, 412 was a continuous line that included one or more straight lines. However, functions and effects similar to those of the above-mentioned embodiments can be obtained even if the border contains kinks in which two lines are connected at a prescribed angle, as long as the connecting angle is larger than 90°. Such an example can be seen in FIG. 8, in which the border of the insulation layer 400 and the through-holes 411, 412 is a rectangle in which the four corners are linearly-chamfered. In the example shown in FIG. 8, there is a kink at each point where one of the sides meets one of the corners. In other words, each corner has two kinks. FIG. 9 shows another example in which each corner is chamfered using a series of straight lines. In other words, each corner contains at least three (in the case of FIG. 9, exactly three) kinks.

While a thin film capacitor was described as one example of a thin film electronic component in the above-mentioned embodiment, the present invention can be applied to any type of electronic component. One such example is a variable capacitance thin film capacitor containing a variable capacitance capacitor section that has a MIM (metal-insulator-metal) structure.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A thin film electronic component, comprising:
   a substrate;
   a thin film electrode layer over the substrate;
   an inorganic insulation layer formed on said thin film electrode layer;
   an organic insulation layer formed on said inorganic insulation layer; and
   a lead-out electrode that electrically connects to the thin film electrode layer,
   wherein the inorganic insulation layer has a through-hole formed therein, so as to expose a portion of the thin film electrode layer,
   wherein the organic insulation layer has a through-hole formed therein, so as to expose the through-hole in the inorganic insulation layer,
   wherein said lead-out electrode is formed in the through-hole in the inorganic insulation layer and the through-hole in the organic insulation layer,
   wherein a shape of a borderline defining the through-hole at a top surface of the organic insulation layer in a plan view has chamfered corners,
   wherein the shape of the borderline defining the through-hole in the organic insulation layer is a substantially rectangular shape having round-chamfered corners, and
   wherein a radius of curvature of the round-chamfered corners is greater than a thickness of the organic insulation layer.

2. The thin film electronic component according to claim 1, further comprising:
   a lower electrode layer over the substrate and under said thin film electrode layer; and
   a thin film dielectric layer sandwiched between the lower electrode layer and said thin film electrode layer, thereby forming a capacitor composed of the lower electrode layer, the thin film dielectric layer, and the thin film electrode layer.

3. The thin film electronic component according to claim 1, further comprising:
   an upper electrode layer over a portion of said thin film electrode layer; and
   a thin film dielectric layer sandwiched between the portion of said thin film electrode layer and the upper electrode layer, thereby forming a capacitor composed of the portion of the thin film electrode layer, the thin film dielectric layer, and the upper electrode layer,
   wherein a portion of the thin film electrode layer that is not overlapped by the upper electrode layer is connected to the lead-out electrode via the through-hole.

* * * * *